March 28, 1961 R. W. STUART, JR 2,977,540

ELECTRIC SWITCHING CIRCUITS

Filed March 10, 1958 2 Sheets-Sheet 1

INVENTOR.
ROBERT W. STUART, JR.
BY Rines and Rines
ATTORNEYS

March 28, 1961 R. W. STUART, JR 2,977,540

ELECTRIC SWITCHING CIRCUITS

Filed March 10, 1958 2 Sheets-Sheet 2

INVENTOR.
ROBERT W. STUART, JR.
BY Rines and Rines
ATTORNEYS

United States Patent Office 2,977,540

Patented Mar. 28, 1961

2,977,540

ELECTRIC SWITCHING CIRCUITS

Robert W. Stuart, Jr., Natick, Mass., assignor to General Radio Company, Cambridge, Mass., a corporation of Massachusetts Filed Mar. 10, 1958, Ser. No. 720,186

6 Claims. (Cl. 328—49)

Figures 1, 2:
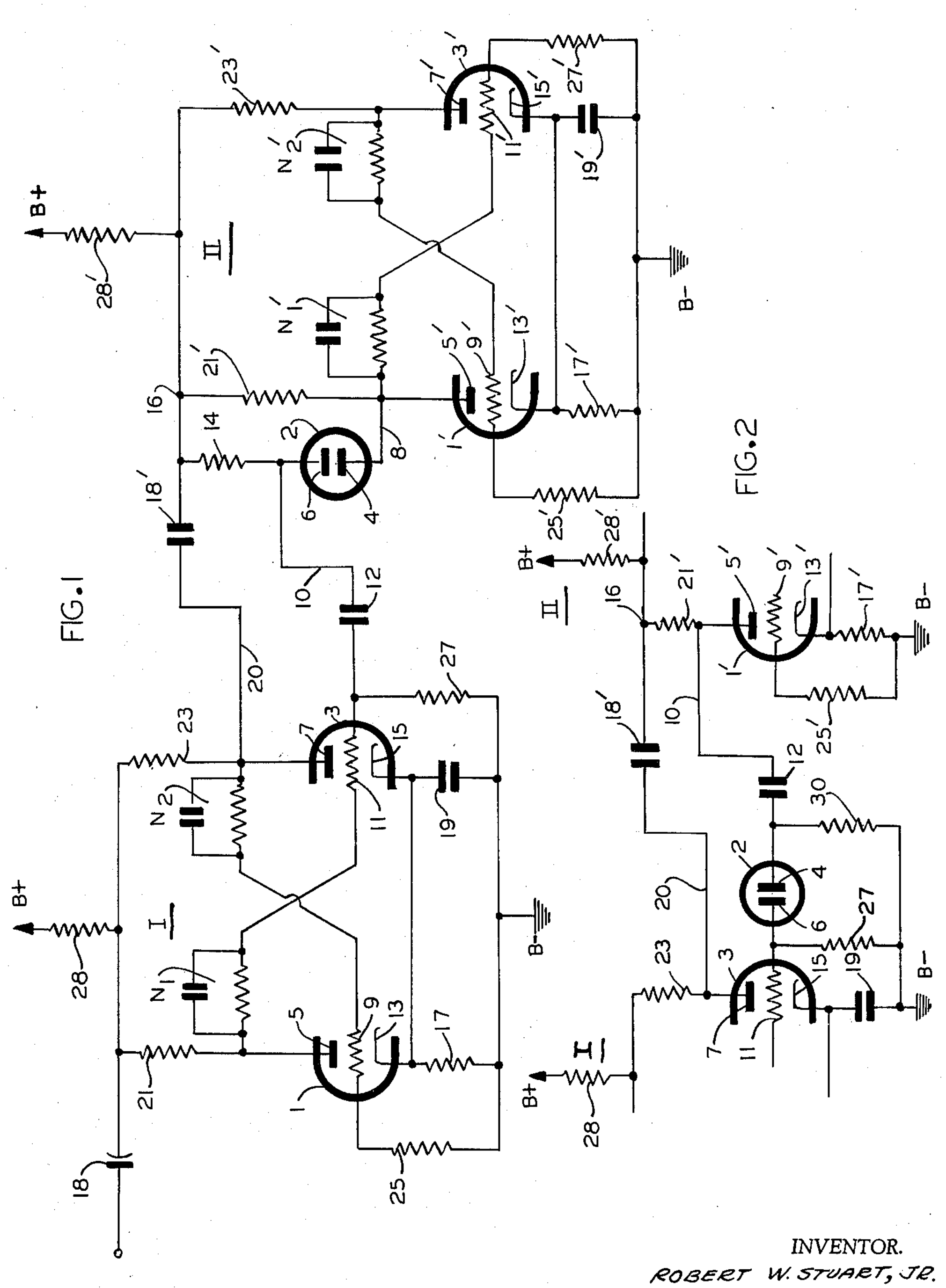

The present invention relates to electric switching circuits and, more particularly, to those employed in binary counting systems and the like.

In successively connected electrical switching, or counting, circuits it is frequently necessary to have a particular operation of a switching circuit automatically reset a preceding switching circuit to a predetermined state. Many types of feedback circuits have accordingly been evolved, for example, for interconnecting successive switching circuits or stages of a binary counting system, such as decimally-coded-binary counters, in order to insure that operation of a particular binary from one of its two states to the other will automatically reset a preceding binary to a predetermined state.

If one attempts to employ conventional capacitance feed-back coupling from one such stage to a preceding stage in order to control the operational state of the preceding stage, no isolation is provided between the stages. Operation of the preceding stage can thus undesirably affect the next successive stage. Not only must impedance isolation between the stages be provided, therefore, but there must also be polarity discrimination, since it is desired that only those signals be coupled back that have the proper polarity for controlling the setting of the preceding stage to the desired state. If, accordingly, resistance is added to the capacitive feed-back coupling circuit, adequate isolation can be obtained. Unfortunately, however, such added series resistance cooperates with the shunt input capacitance of the preceding stage greatly to affect the feed-back circuit bandwidth. With the resistance-capacitance feedback network, moreover, it is difficult to obtain a good compromise between performance and reliability, though good reliability can be had at prohibitively low speeds.

Systems employing successive sets of bistable multivibrator or "flip-flop" stages have, therefore, been provided with special feed-back circuits embodying vacuum diodes that insure that the operation of a stage in a predetermined state sets the preceding stage to a desired operational state and that polarity and impedance isolation between the stages are attained. If the diode is of the vacuum type, however, it requires the consumption of appreciable power. If, on the other hand, resort is had to crystal diodes, the circuit becomes critically subject to the environmental temperature of the apparatus, imposing undesirable restrictions upon the system. Crystal diodes, furthermore, in many cases, do not possess a sufficiently high back-impedance to provide the necessary isolation between the successive circuits.

An object of the present invention, accordingly, is to provide a new and improved switching-circuit arrangement whereby a switching circuit or stage may be connected through an appropriate feed-back path to set a preceding circuit or stage in a desired state without any of the above-described disadvantages of the resistance-capacitance or diode feed-back circuits.

A further object is to provide a new and improved feed-back path for switching systems of this character.

Other and further objects will be explained hereinafter and will be more particularly pointed out in the appended claims.

Figure 3:
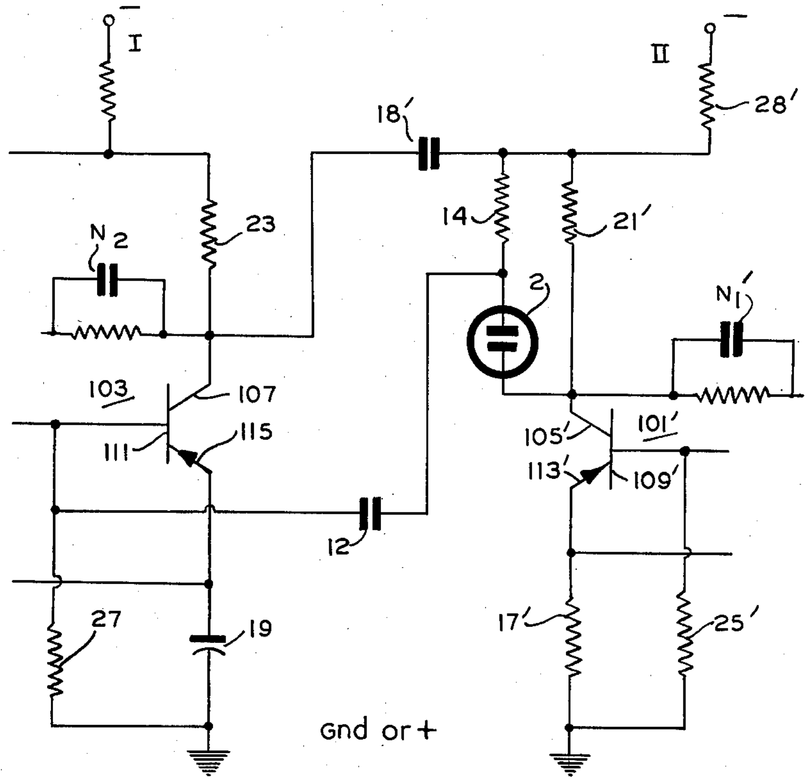

The invention will now be described in connection with the accompanying drawing, Fig. 1 of which is a schematic circuit diagram illustrating the invention in preferred form; and Figs. 2 and 3 are similar partial diagram of modifications.

Referring to Fig. 1, a pair of binary counting multivibrator circuits are shown as successive stages I and II. Stage I comprises a pair of electron-tube relays 1, 3 which may, if desired, be embodied in the same envelope. The tubes 1 and 3 have respective plates or anodes 5 and 7, control electrodes 9 and 11, and cathodes 13 and 15. The anodes 5 and 7 are shown respectively coupled through resistance-capacitance networks N1 and N2 to the control electrodes 11 and 9 of the respective tubes 3 and 1, as is conventional in switching circuits of this character. The cathodes 13 and 15 are respectively connected through a resistor 17 and a capacitor 19 to a ground or B— terminal of the anode plate-supply voltage source. The term "ground," as used herein, is intended to connote not only actual earthing but also chassis or other reference potential. The anodes 5 and 7 are connected through respective anode loads 21 and 23 and a common anode load 28 to the positive or B+ terminal of the plate-supply voltage source. Negative trigger impulses for operation of the multivibrator I may be supplied through the input coupling capacitor 18. Grid resistors 25 and 27 are shown respectively connected between the control electrodes 9 and 11 and the B— terminal.

Since the next successive switching stage II in Fig. 1 is substantially identical with stage I, similar parts have been given the same reference numbers but augmented with a prime notation.

It is common to refer to the two operational states of such switching stages as the 0 and 1 states or conditions. Tube 3 of stage I, for example, may be conducting while tube 1 is cut off (state 0), and tube 3 may be cut off while tube 1 is conducting (state 1). The input trigger-impulse signal fed through capacitor 18 will serve to reverse the state of the multivibrator I from that state which is assumed prior to the trigger signal. When a square-wave input is applied to capacitor 18, only the negative, and not the positive, swings thereof will switch the multivibrator from 0 state to 1 state, or from 1 state to 0 state. If the next multivibrator stage II is connected to the multivibrator stage I, therefore, it will be triggered at half the rate that the multivibrator stage I is triggered. Through his technique, the well-known dividing chains for frequency division by power-of-two integers is provided. It is when division by other integer numbers is required, however, as in decade counters, that the before-mentioned feedback circuits between the switching stages must be provided.

Assume, for example, that there were no such feedback connection in Fig. 1 and that both stages I and II were initially in the 0 state. Each negative trigger impulse at the input capacitor 18 will advance the multivibrators I—II as follows: 0—0, 1—0, 0—1, 1—1, 0—0, etc. A so-called scale-of-four thus results, such that a further stage (not shown) beyond the stage II, would be triggered at one-fourth the input rate to the stage I. With the hereinafter more fully described feedback path connected between stages II and I, however, the sequence becomes 0—0, 1—0, 1—1, 0—0, etc., i.e., a scale-of-three. The feedback, which effectively subtracts one operational state from the sequence, has in this case removed the 0—1 state between states 1—0 and 1—1, providing for division by other than a power-of-two. The reason for this elimination of the transition 0—1, as later explained in more detail, resides in the fact that the state 0-to-state 1 transition of stage II served to reset stage I from state 0 to state 1.

In accordance with the present invention, this feedback path or circuit between the anode 5′ of the tube 1′, associated with the second multivibrator switching circuit or stage II, and the control electrode 11 of the tube 3 of the preceding multivibrator switching circuit or stage I includes a special kind of an impedance element. Unlike the beforementioned diodes, either of the vacuum or crystal type, the non-linear coupling device used in the feed-back path of the present invention is a bilaterally conducting device having threshold-voltage operated regions in both directions of conduction. A preferred form is the conventional two-electrode cold gaseous-discharge tube, shown at 2, such as a neon tube. The electrode 4 of the neon tube 2 is connected by a conductor 8 to the anode 5′ of the tube 1′ of the second multivibrator switching circuit or stage II. The other electrode 6 of the neon tube 2 is shown connected by the conductor 10 through a capacitor 12 to the control electrode 11 of the electron tube 3 of the preceding switching circuit or stage I. The neon tube 2 and the capacitance 12 are thus series-connected in this feed-back path between the anode 5′ of the electron tube 1′ and the control electrode II of the electron tube 3.

When the neon tube 2 is non-conducting, of course, it provides excellent isolation between the anode 5′ and the control electrode 11 since it presents a very high impedance. When the neon tube 2 conducts, moreover, it has been found to present a very high inductance of the order of a henry, more or less, which further serves as an isolator. The tube 2 thus isolates in both its conductive and cut-off states, though for the two different reasons above given. It will be observed, however, that the electrode 6 of the tube 2 is connected through a resistor 14 to a point of higher potential than the anode 5′, namely, to the common anode terminal 16 of multivibrator II. The neon tube 2 is thus connected across the anode-load resistor 21′. Also connected from the common anode terminal 16 of multivibrator II is an alternating-current coupling capacitor 18′ which connects by conductor 20 to the anode 7 of the tube 3 of the preceding multivibrator switching stage I.

When the preceding stage I is in state 1, for example, and the next successive stage II is in state 0, the next negative trigger pulse at the input capacitor 18 will, as before described, set the stage I to state 0 and the stage II to state 1. If there were no feedback, stage I would remain in state 0. As multivibrator II switches to the condition or state 1 with tube 1′ conducting and tube 3′ cutoff, the voltage at anode 5′ will drop and there will be developed across the feedback neon tube 2 a voltage of sufficient threshold value to cause conduction of the tube 2. Some of the resulting voltage drop across the anode load 21′ will thus be conveyed back through the feedback path comprising the neon tube 2 and the capacitor 12 to the control-electrode 11 of the tube 3, commencing to cut-off the tube 3 of the preceding stage I, and thereby resetting stage I to state 1 with tube 3 cut-off. In view of the nature of the threshold-voltage-operated bi-laterally conducting device 2, this resetting of the control electrode 11 of the tube 3 of the preceding stage I is positive and decisive. The use of a small capacitance 12 of the order of 22 micro-micro-farads, more or less, will assist in the development of a high-voltage pulse for decisively resetting the preceding stage I.

When tube 1′ cuts off again, its anode 5′ rises, cutting off the tube 2. Capacitor 12 re-charges slowly through the relatively large resistor 14. The chances of re-triggering tube 3 are thus negligible since little energy can be coupled back during this period.

The use of the neon tube 2 thus provides excellent isolation during a period when it is non-conducting and during conduction, and provides the desired polarity feed-back path when the switching of the second stage II is intended to control and insure the resetting of the preceding stage I. All of this is done, moreover, with reliability at speeds or rates that the resistance-capacitance feedback technique cannot reliably handle. The neon tube feed-back path, moreover, is less expensive than the previously described diode circuits.

While the system of Fig. 1 is preferred, the neon tube 2 may also be located at other positions in the feedback path. Thus, in Fig. 2, the tube 2 is shown with its electrode 6 directly connected to the control electrode 11 of the tube 3 and its electrode 4 connected through the capacitor 12 and the conductor 10 to the anode 5′ of the electron tube 1′. A resistor 30 is connected from the neon-tube electrode 4 to the ground terminal B— so as to connect the tube 2 in series with the resistor 30 as a shunt circuit across the control electrode 11, resistor 27, and ground.

In the systems of both Figs. 1 and 2, since the ionization time delay after a voltage is applied to the neon tube 2 is of the order of 10 to 25 microseconds, the circuit works best for maximum decade input speeds of the order of 40 kilocycles per second more or less. Such circuits thus perform well in the lower-speed decades of an electronic counting system. Before the tube 2 conducts in the circuit of Fig. 2, however, the voltage available for bulb firing does not remain constant during the ionization period, but it tends to leak off. In Fig. 1, on the other hand, the tube 1′ maintains the full ionizing voltage across the tube 2 for the complete time that the anode 5′ remains negative, or until tube 2 fires. The circuit of Fig. 1 is therefore somewhat more reliable than that of Fig. 2.

While the invention has been described in connection with electron-tube circuits, it is to be undertsood that other types of relay devices, including transistors, may also usefully employ the novel coupling circuits of the present invention. High-voltage transistors, for example, such as the type RCA 2N398, may be employed, as illustrated in Fig. 3. The system of Fig. 3 is analogous to that of Fig. 1, except that transistor relays are employed. The transistors 103 and 101′ replace the electron-tube relays 3 and 1′ of the successive switching circuits, with respective bases 111 and 109′, emitters 115 and 113′, and collectors 107 and 105′ connected into circuit in a manner analogous to the connections of the corresponding electron-tube electrodes 11, 9′; 15, 13′; and 7, 5′.

Though the preferred use of the novel-alternating-current coupling circuits of the present invention resides in the switching-circuit feedback-path application, it is also to be understood that such coupling circuits are more broadly useful wherever their advantageous properties are desired.

Other non-linear devices 2 which, unlike the beforementioned diodes, are threshold-voltage operated in either direction, and are thus bi-laterally conducting non-linear devices, include thyrites and magnetic materials which can be operated near their initial permeability region, as is well known. With neon devices 2, moreover, an ambient light source is required for proper operation.

Further modifications will occur to those skilled in the art, and all such are considered to fall within the spirit and scope of the invention as defined in the appended claims.

What is claimed is:

1. In an electric system having successive switching circuits embodying electron tubes provided with anode, control and cathode electrodes and the occurrence of a predetermined operational condition in one of which is to set a preceding circuit to a predetermined state, a feed-back path connected between an anode electrode of an electron tube of the said one circuit and a control electrode of an electron tube of the said preceding circuit comprising a two-electrode gaseous-discharge device connected in series circuit with capacitance, an anode load connecting the said anode electrode of the electron tube of the said one circuit to a source of anode potential, means for connecting the said gaseous-discharge device across the anode load, and an alternating-current path connected between the anode of the electron tube of the said preceding circuit and a point of the anode load of higher potential than the point of connection of the said feed-back path to the said anode electrode of the electron tube of the said one circuit.

2. In an electric system having successive switching circuits embodying electron tubes provided with anode, control and cathode electrodes and the occurrence of a predetermined condition in one of which is to set a preceding circuit to a predetermined state, a feed-back path connected between an anode electrode of an electron tube of the said one circuit and a control electrode of an electron tube of the said preceding circuit comprising a two-electrode gaseous-discharge device connected in series circuit with capacitance, the cathode of the said electron tube of the preceding circuit being returned to ground, and resistance connected in circuit with the gaseous-discharge device between the control electrode of the electron tube of the said preceding circuit and ground.

3. In a binary counting system having successive multivibrator switching circuits embodying electron tubes provided with anode, control and cathode electrodes and the occurrence of a predetermined operational condition in one of which is to set a preceding multivibrator circuit to a predetermined state, a feed-back path connected between an anode electrode of an electron tube of the said one multivibrator circuit and a control electrode of an electron tube of the said preceding multivibrator circuit comprising a two-electrode neon tube connected in series circuit with capacitance, an anode load one terminal of which is connected to the point of connection of the said feed-back path to the said anode electrode of the said one multivibrator circuit and the other terminal of which connects to a source of anode potential, an electric circuit connecting the neon tube between the said terminals of the anode load, and a capacitor coupling the said other terminal of the anode load to the anode electrode of the said electron tube of the said preceding multivibrator circuit.

4. In an electric system having successive switching circuits embodying relay devices provided with output and input electrodes and in one of which the occurrence of a predetermined operational condition is to set a preceding circuit to a predetermined state, a feed-back path connected between an output electrode of a relay device of the said one circuit and an input electrode of a relay device of the said preceding circuit comprising a two-electrode gaseous-discharge device connected in series circuit with capacitance, an output-electrode load connecting the said output electrode of the relay device of the said one circuit to a source of output-electrode potential, means for connecting the said gaseous-discharge device across the said load, and an alternating-current path connected between the said output electrode of the relay device of the said preceding circuit and a point of the said load of different potential than the point of connection of the said feed-back path to the said output electrode of the relay device of the said one circuit.

5. In an electric system having successive switching circuits embodying relay devices provided with output and input electrodes and in one of which the occurrence of a predetermined operational condition is to set a preceding circuit to a predetermined state, a feed-back path connected between an output electrode of a relay device of the said one circuit and a first input electrode of a relay device of the said preceding circuit comprising a two-electrode gaseous-discharge device connected in series circuit with capacitance, a second input electrode of the said relay device of the preceding circuit being returned to ground, and resistance connected in circuit with the gaseous-discharge device between the said first input electrode of the relay device of the said preceding circuit and ground.

6. In a binary counting system having successive multivibrator switching circuits embodying relay devices provided with output and input electrodes and in one of which the occurrence of a predetermined operational condition is to set a preceding multivibrator circuit to a predetermined state, a feed-back path connected between an output electrode of a relay device of the said one multivibrator circuit and an input electrode of a relay device of the said preceding multivibrator circuit comprising a two-electrode neon tube connected in series circuit with capacitance, an output-electrode load one terminal of which is connected to the point of connection of the said feed-back path to the said output electrode of the said one multivibrator circuit and the other terminal of which connects to a source of output electrode potential, an electric circuit connecting the neon tube between the said terminals of the load, and a capacitor coupling the said other terminal of the load to the output electrode of the said relay device of the said preceding multivibrator circuit.

References Cited in the file of this patent

UNITED STATES PATENTS

| | | |
|---|---|---|
| 2,233,165 | Goldman | Feb. 25, 1951 |
| 2,584,363 | Mumma | Feb. 5, 1952 |
| 2,622,212 | Anderson et al. | Dec. 16, 1952 |
| 2,676,756 | Gulley | Apr. 27, 1954 |
| 2,678,390 | Abelew | May 11, 1954 |
| 2,747,111 | Kock | May 22, 1956 |
| 2,803,747 | Woods | Aug. 20, 1957 |
| 2,832,065 | Disson et al. | Apr. 22, 1958 |
| 2,863,052 | Fraser | Dec. 2, 1958 |
| 2,869,115 | Doeleman et al. | Jan. 13, 1959 |
| 2,874,333 | Gray | Feb. 17, 1959 |